United States Patent
Liang et al.

(10) Patent No.: US 10,003,025 B2
(45) Date of Patent: Jun. 19, 2018

(54) EDOT FUNCTIONALIZED CONJUGATED POLYMER AND PHOTODETECTOR CONTAINING THE SAME

(71) Applicant: SOUTH UNIVERSITY OF SCIENCE AND TECHNOLOGY OF CHINA, Shenzhen (CN)

(72) Inventors: Yongye Liang, Shenzhen (CN); Tingbin Yang, Shenzhen (CN); Luozheng Zhang, Shenzhen (CN); Xugang Guo, Shenzhen (CN)

(73) Assignee: SOUTH UNIVERSITY OF SCIENCE AND TECHNOLOGY OF CHINA, Shenzhen (CN)

(*) Notice: Subject to any disclaimer, the term of this patent is extended or adjusted under 35 U.S.C. 154(b) by 0 days. days.

(21) Appl. No.: 15/511,159

(22) PCT Filed: Sep. 23, 2014

(86) PCT No.: PCT/CN2014/087181
§ 371 (c)(1),
(2) Date: Mar. 14, 2017

(87) PCT Pub. No.: WO2016/044992
PCT Pub. Date: Mar. 31, 2016

(65) Prior Publication Data
US 2017/0279051 A1  Sep. 28, 2017

(51) Int. Cl.
C08G 75/00 (2006.01)
H01L 51/00 (2006.01)
H01L 51/42 (2006.01)

(52) U.S. Cl.
CPC ...... H01L 51/0037 (2013.01); H01L 51/0047 (2013.01); H01L 51/4253 (2013.01)

(58) Field of Classification Search
CPC .......... H01L 51/0036; H01L 51/0047; C08G 2261/3243
See application file for complete search history.

(56) References Cited

U.S. PATENT DOCUMENTS

2003/0088032 A1* 5/2003 Luebben .............. C08F 293/00
525/410

* cited by examiner

*Primary Examiner* — Shane Fang
(74) *Attorney, Agent, or Firm* — Hodgson Russ LLP

(57) ABSTRACT

The present invention is generally directed to the field of organic semiconductor material. It provides a donor-acceptor conjugated polymer containing 3,4-ethylenedioxythiophene ring as a side chain and a photodetector device containing the same.

12 Claims, 8 Drawing Sheets

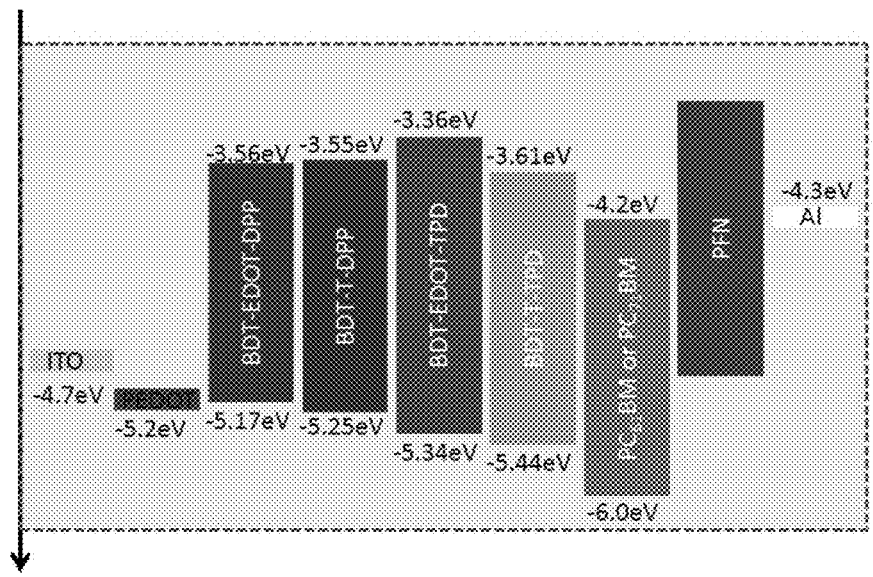
Figure 3
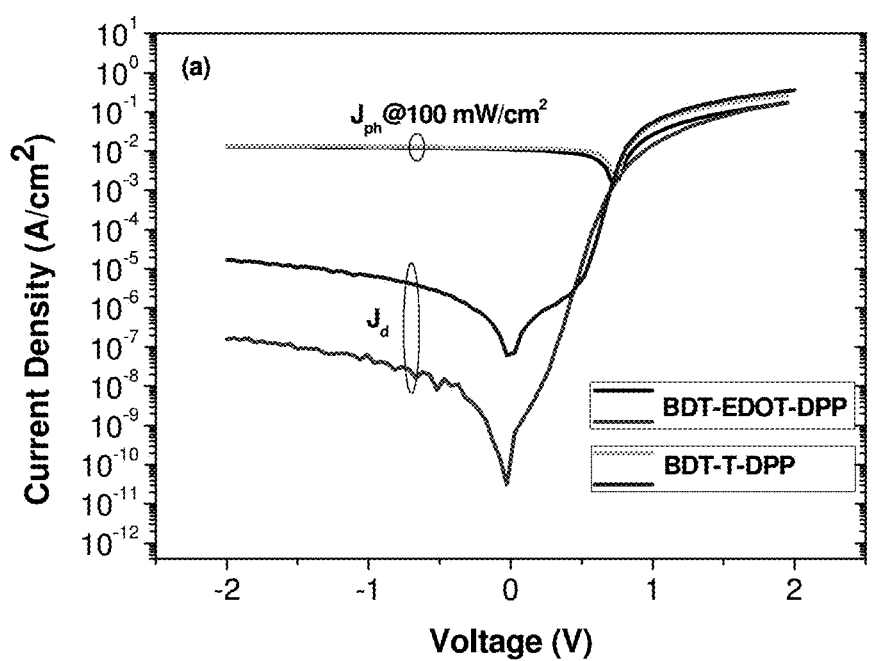

EDOT FUNCTIONALIZED CONJUGATED POLYMER AND PHOTODETECTOR CONTAINING THE SAME

CROSS-REFERENCE TO RELATED APPLICATION

This application is the U.S. national phase of PCT Application No. PCT/CN2014/087181 filed on Sep. 23, 2014, the entire content of which is incorporated herein by reference.

TECHNICAL FIELD

The present application is generally directed to the field of organic semiconductor material, in particular, to a donor-acceptor conjugated polymer containing 3-4-ethylenedioxythiophene (EDOT) as side chain and a photodetector device containing the same.

BACKGROUND ART

As a class of semiconducting device to transform detected light into electrical signal, photodetectors are of great importance for a variety of applications, such as image sensing, data communication, remote control and so forth. Currently, the commercially available active materials for photodetectors are mainly based on inorganic semiconducting materials, such as ZnO, Si, GaAs and PbS. These materials typically have detectivity greater than $10^{12}$ Jones but suffer from high expense and relatively rigor working conditions (e.g., GaAs detectors have to work at very low temperature). In addition, these inorganic materials are fragile, non-foldable and have low malleability, limiting their applications in novel and high-demanding fields. Therefore, alternatives to such commercial materials are expected and necessary regarding the merits of low-cost, mild working conditions, and novel characteristics, such as flexibility and semitransparency.

Conjugated polymers have attracted broad interest from academy and industry as a new class of emiconductor due to their advantages of low-cost, simple processing, flexibility and semi-transparency. High external efficiency, fast response, and detection to near infrared (NIR) range (1450 nm) have been demonstrated in polymer photodetectors. Besides, they are suitable for large area detection and could be operated at room temperature and flexible substrates, affording new opportunities for sensing and detecting technologies. Similar to that of polymer solar cells, bulk heterojunction structure is employed to construct polymer photodetectors, with conjugated polymer as the electron donor and fullerene derivative as the electron acceptor. It favors photon absorption and charge separation, affording high external quantum efficiency. However, it usually generates a relative high dark current density at negative bias and low rectification ratio between forward/reverse bias, remaining difficult to achieve high detectivity over the broad spectral range from ultraviolet (UV) to NIR. There are many strategies to develop new polymer photodetectors with high detectivity including interfacial engineering, morphology control of the active layer, and improvement of structure, but few works reported are related to molecular structure design.

Technical Problem

An objective of the present invention is to provide a high-detectivity organic conjugated polymer with repeated donor-acceptor moieties comprising an EDOT as a side chain.

Another objective of the present invention is to provide a process for improving the detectivity of a donor-acceptor polymer by adding a 3,4-ethylenedioxythiophene (EDOT) to the backbone thereof as a side chain.

A further objective of the present invention is to provide a photodetector device comprising a photoactive layer including the organic conjugated polymer.

Technical Solution

According to an embodiment of the present invention, a donor-acceptor conjugated polymer comprising a 3,4-ethylenedioxythiophene (EDOT) of formula (I) connected to the backbone of the polymer as a side chain is provided,

(I)

wherein $R_1$ is selected from the group consisting of C1-C20 alkyl, C1-C20 alkoxyl and C1-C20 alkylthiol groups.

According to a preferred embodiment, $R_1$ is selected from the group consisting of $CH_3$, $C_2H_5$, $C_4H_9$, $C_6H_{13}$, $C_8H_{17}$, $C_{12}H_{25}$, 2-ethylhexyl, 2-butyloctyl, 2-hexyldecyl, and 2-octyldodecyl.

According to a further embodiment of the present invention, a photoactive layer comprising a conjugated polymer blended with a fullerene derivative is provided, wherein the conjugated polymer has an EDOT functional unit of the above formula (I) in the side chain.

Specifically, the fullerene derivative according to an embodiment is selected from the group consisting of $PC_{61}BM$ and $PC_{71}BM$.

According to an embodiment of the present invention, the 3,4-ethylenedioxythiophene (EDOT) rings of formula (I) is connected to each donor unit on the backbone of the polymer on one side or both sides, i.e., the molar ratio of EDOT to donor unit in the conjugated copolymer is 1:1 or 2:1.

According to an embodiment of the present invention, a photodetector device comprising a semiconducting conjugated polymer blended with a fullerene derivative as the photoactive layer is provided. The semiconducting conjugated polymer has an EDOT functional unit of the above formula (I) in the side chain, which can effectively depress the dark current, without significant impact on the photocurrent.

According to another yet embodiment of the present invention, a method for improving the detectivity of a donor-acceptor polymer by connecting a 3,4-ethylenedioxythiophene of the above formula (I) as a side chain to the donor moiety of the backbone of the polymer is provided.

According to an embodiment of the present invention, the photoactive layer is sandwiched between two electrodes, without an electron blocking layer or a hole extracting layer.

Advantageous Effects

According to the embodiments of the present invention, the introduction of EDOT or the derivative thereof significantly lowers the dark current of the photodetecting device by about 2 magnitudes and increases the photodetectivity by more than 1 magnitude compared to the control device made of polymer without EDOT side chain. This process can be applied to a variety of donor-acceptor type semiconducting polymers with photo-response covering from UV to NIR.

DESCRIPTION OF DRAWINGS

The accompanying drawings, which are incorporated in and form as a part of the specification, illustrate embodiments of the present invention.

FIG. 3 shows the energy levels of the electron donor, electron acceptor, interfacial layer and electrode according to an embodiment of the present application.

MODE FOR INVENTION

Figure 1:
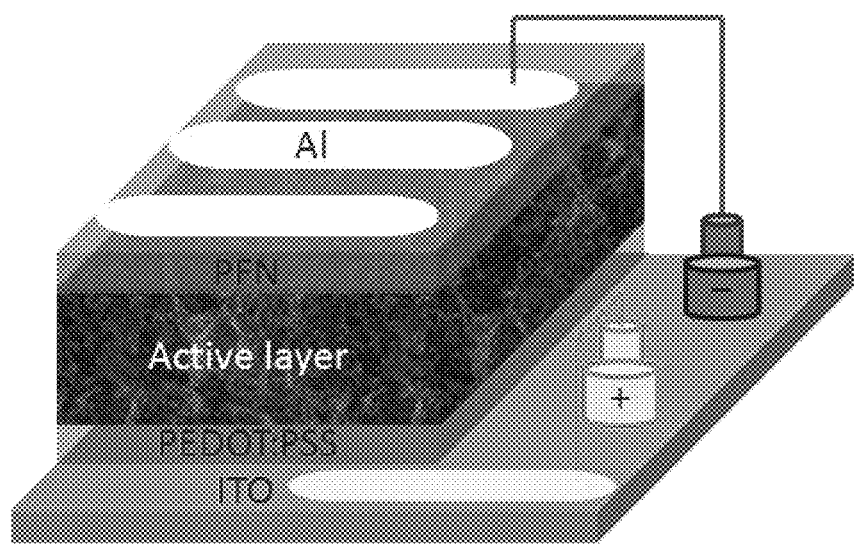
FIG. 1 shows the schematic structure of an optoelectronic device according to an embodiment of the present application.

The following description is of preferred embodiments by way of example only and without limitation to the combination of features necessary for carrying the invention into effect.

The present application provides a donor-acceptor conjugated polymer comprising a 3,4-ethylenedioxythiophene (EDOT) unit of following formula (I) connected to the donor unit of the backbone,

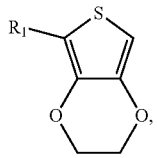

(I)

wherein $R_1$ is selected from the group consisting of C1-C20 alkyl, C1-C20 alkoxyl and C1-C20 alkylthiol groups. Preferably, $R_1$ is selected from the group consisting of $CH_3$, $C_2H_5$, $C_4H_9$, $C_6H_3$, $C_8H_{17}$, $C_{12}H_{25}$, 2-ethylhexyl, 2-butyloctyl, 2-hexyldecyl, and 2-octyldodecyl. More preferably, $R_1$ is a 2-ethylhexyl group.

According to an embodiment of the present application, there may be one or two EDOT units connected to each donor moiety on the backbone of the polymer. Preferably, there are two EDOT units connected to both sides of each donor moiety on the backbone of the polymer.

According to an embodiment of the present application, the conjugated copolymer has a backbone of donor-acceptor structure, wherein the molar ratio of donor moiety to acceptor moiety (D/A ratio) in the backbone is 1:1, as shown as follows.

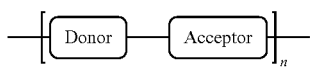

According to an embodiment of the present application, the number of the repeated donor-acceptor units in the backbone is 10 to 100.

The donor unit in the conjugated polymer according to an embodiment of the present application may be the one commonly used in the field of organic photoelectric material. Preferably, the donor unit may be selected from group consisting of benzo[3,4-b]dithiophene, thiophene, benzene and the derivatives thereof.

According to a preferable embodiment of the present application, the donor moiety of the conjugated copolymer can be any one of the following structures,

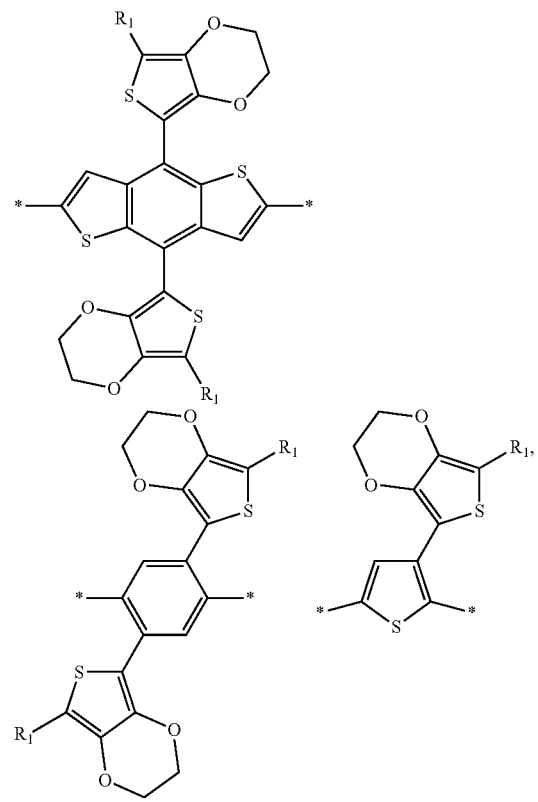

wherein $R_1$ is the same group as described in formula (I). More preferably, the donor moiety of the copolymer is benzo[3,4-b]dithiophene or the derivatives thereof.

According to an embodiment of the present application, the acceptor unit on the backbone of the copolymer may be any one of the rings represented by the following structures,

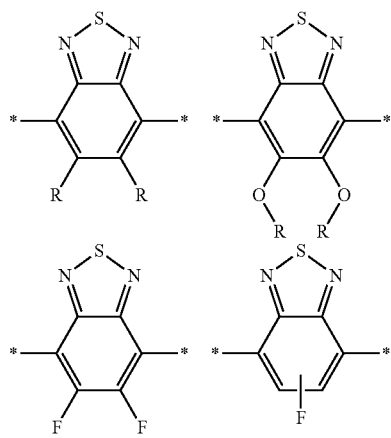

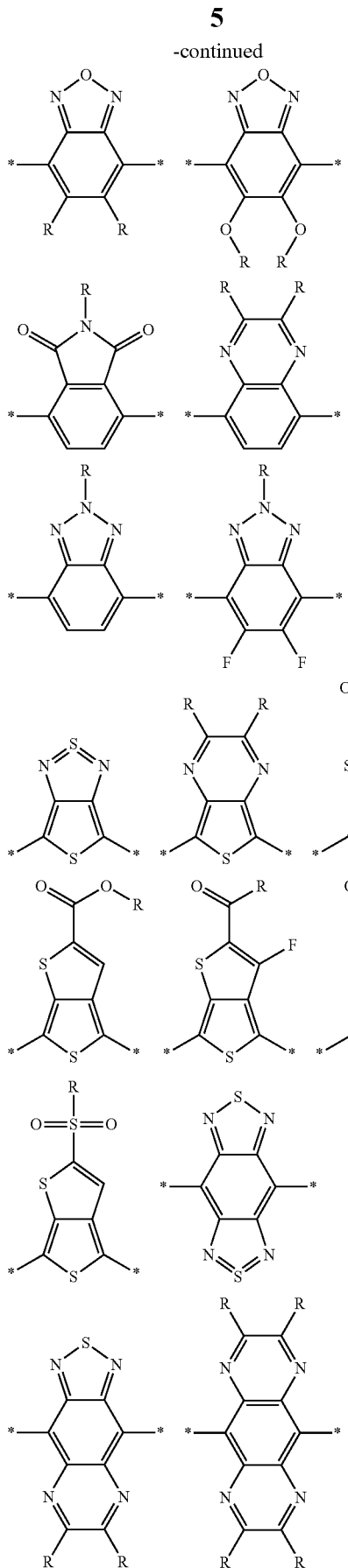

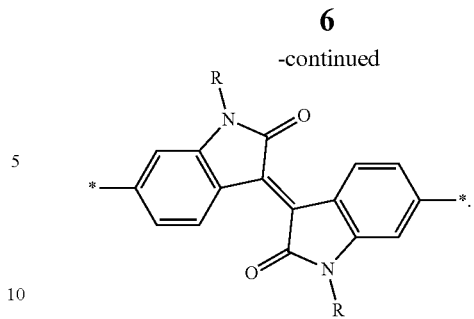

In particular, the acceptor unit on the backbone of the copolymer may be selected from the group consisting of benzo[c][1,2,5]thiadiazole, benzo[c][1,2,5]oxadiazole, isoindoline-1,3-dione, quinoxaline, benzo[d][1,2,3]triazole, thieno[3,4-c][1,2,5]thiadiazole, thieno[3,4-b]pyrazine, thieno[3,4-b]thiophene, benzo[1,2-c:4,5-c']bis([1,2,5]thiadiazole), [1,2,5]thiadiazolo[3,4-g]quinoxaline, pyrazino[2,3-g]quinoxaline, [3,3'-biindolinylidene]-2,2'-dione, and the derivatives thereof, where R is selected from the group consisting of H, $CH_3$, $C_2H_5$, $C_4H_9$, $C_6H_3$, $C_8H_7$, $C_{12}H_{25}$, 2-ethylhexyl, 2-butyloctyl, 2-hexyldecyl, and 2-octyldodecyl.

Preferably, the acceptor unit in the conjugated polymer is a compound containing diketopyrrolopyrrole (DPP) or the derivative thereof.

According to a preferable embodiment of the present application, DPP and thienopyrroledione (TPD) are employed as acceptor units as they can endow the obtained copolymers with good photovoltaic performance.

The following examples illustrate the present application in detail without limiting the scope thereof. In the following examples, only the copolymers containing BDT (benzo[1,2-b:4,5-b']dithiophene) as a donor unit and DPP, TPD or thienoisoindigo (TIIDG) as an acceptor unit are illustrated, however, the copolymers containing other donor units and acceptor units listed above can be prepared in similar processes to those of Examples 1-3.

Some examples of EDOT(EH) added to a D-A copolymer as a side chain are described below, however, those skilled in the art should appreciate that other derivatives of EDOT represented by formula (I) are all suitable for connecting to the donor moiety on the backbone of the copolymer.

Example 1 Synthesis of BDT-EDOT-DPP

1. Preparation of $Sn_2$-BDT-EDOT(EH) as Donor Unit

The synthesis of $Sn_2$-BDT-EDOT(EH) was carried out in accordance with the following procedure.

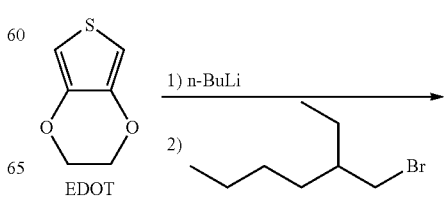

-continued

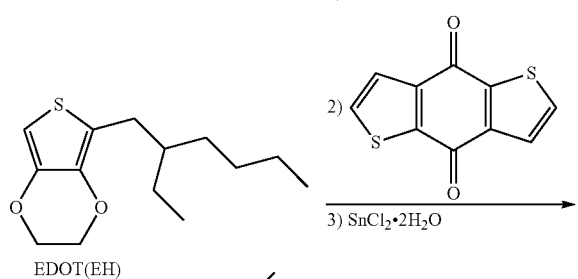

EDOT(EH)

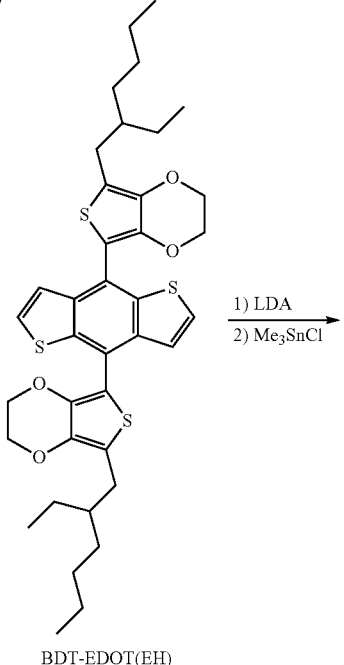

BDT-EDOT(EH)

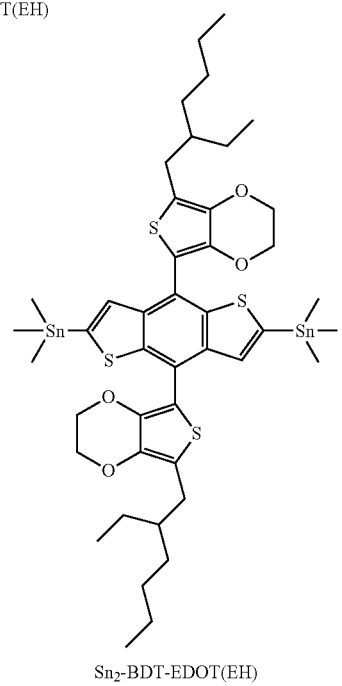

Sn₂-BDT-EDOT(EH)

A 3,4-ethylenedioxythiophene (EDOT) was firstly functionalized with a 2-ethylhexyl chain to give 5-(2-ethylhexyl)-2,3-dihydrothieno[3,4-b][1,4]dioxine (EDOT(EH)). Then such EDOT(EH) was reacted with benzo[1,2-b:4,5-b'] dithiophene-4,8-dione to afford an EDOT substituted benzo[1,2-b:4,5-b']dithiophene (BDT-EDOT(EH)). The resulted BDT-EDOT(EH) was further functionalized through lithiation with lithium diisopropylamide (LDA) and subsequent stannylation with Me₃SnCl to give the title compound.

Synthesis of 5-(2-ethylhexyl)-2,3-dihydrothieno[3,4-b][1,4]dioxine (EDOT(EH))

To a pre-dried 250 mL flask was charged with a solution of EDOT (8.17 g, 57.46 mmol) in anhydrous THF (115 mL), and this solution was cooled to −78° C. then a solution of n-BuLi (1.6 M) in hexane (37.7 mL) was added dropwise under the protection of argon, the obtained mixture was kept at the temperature of −78° C. for 1.5 hours, then 2-ethylhexyl bromide (22.2 g, 114.95 mmol) was slowly added. The reaction was continued overnight, then quenched with $H_2O$, extracted with $CH_2Cl_2$, and washed with $H_2O$ for 3 times. The obtained organic layer was dried with $MgSO_4$, concentrated at reduced pressure. After distillation (0.1 MPa, 80-85° C.) the target compound (5.49 g) was obtained in 37.55% yield. $^1$H NMR (500 MHz, $CDCl_3$, δ): 6.09 (s, 1H), 4.14 (s, 4H), 2.54 (d, 2H), 1.53 (m, 1H), 1.35-1.25 (m, 8H), 0.87 (m, 6H).

Synthesis of BDT-EDOT(EH)

To a pre-dried 250 mL flask was charged with a solution of EDOT(EH) (5.49 g, 21.58 mmol) in anhydrous THF (87 mL), this solution was cooled to 0° C. then a solution of n-BuLi (1.6 M) in hexane (14.8 mL) was added dropwise under the protection of argon. The obtained mixture was kept at room temperature for 1.5 hours, and then cooled to 0° C. again and benzo[1,2-b:4,5-b']dithiophene-4,8-dione (1.95 g, 8.85 mmol) was added in one portion. The reaction was conducted at 80° C. for 1.5 hours. After cooling again to 0° C., a solution of $SnCl_2 \cdot 2H_2O$ (12.17 g, 53.93 mmol) in 10% HCl (50 mL) was introduced, and the obtained mixture was stirred for another 2 hours at 80° C. After cooling to ambient temperature the mixture was poured into an ice water. The organic layer was extracted with EtOAc, and washed at least 3 times with $H_2O$. Further purification was performed by column chromatography with $CH_2Cl_2$/hexane (v/v, 3:7) as the eluent. The final product (5.04 g) was collected through recrystallizing from EtOH and dried under reduced pressure in 81.94% yield. $^1$H NMR (500 MHz, $CDCl_3$, δ): 7.43 (s, 4H), 4.23 (q, 8H), 2.68 (d, 4H), 1.65 (m, 2H), 1.48-1.32 (m, 16H), 0.90 (m, 12H).

Synthesis of Sn₂-BDT-EDOT(EH)

The BDT-EDOT(EH) (1.5 g, 2.16 mmol) obtained at the previous step was dissolved in anhydrous THF (33 mL) in a 100 mL argon purged flask, and then Lithium diisopropylamide (2.0 M, 3.24 mL) was added at −78° C. The reaction mixture was then stirred for 1.5 hours at this temperature (−78° C.). Subsequently, a solution of trimethylstannyl chloride (1.0 M) in THF (7.12 mL) was added and the obtained mixture was stirred overnight at ambient temperature. The organic layer was extracted with diethyl ether, washed 2 times in water, and concentrated to obtain the crude product. The title compound (1.35 g) was attained through recrystallization from isopropanol in 60.94% yield. $^1$H NMR (500 MHz, $CDCl_3$, δ): 7.46 (s, 2H), 4.24 (dd, 8H), 2.70 (m, 4H), 1.68 (m, 2H), 1.57-1.35 (m, 16H), 0.92 (m, 12H), 0.39 ppm (s, 18H).

2. Preparation of Br₂-DPP(BO) as Acceptor Unit 3,6-bis(5-bromothiophen-2-yl)-2,5-bis(2-butyloctyl)pyrrolo[3,4-c]pyrrole-1,4(2H,5H)-dione (Br₂-DPP(BO)) was synthesized according to the processes reported by E. J. Zhou, et al (E. J. Zhou, S. P. Yamakawa, K. Tajima, C. H. Yang, K. Hashimoto, *Chem. Mater.* 2009, 21, 4055).

3. Preparation of Donor-Acceptor Copolymer

The donor-acceptor copolymer was prepared by Stille poly-condensation reaction between the bis-stannylated BDT-based donor units and dibrominated acceptor units, with Pd(PPh$_3$)$_4$ as a catalyst and toluene/DMF mixture as the reaction solvent.

The preparation process of BDT-EDOT-DPP was summarized as follows.

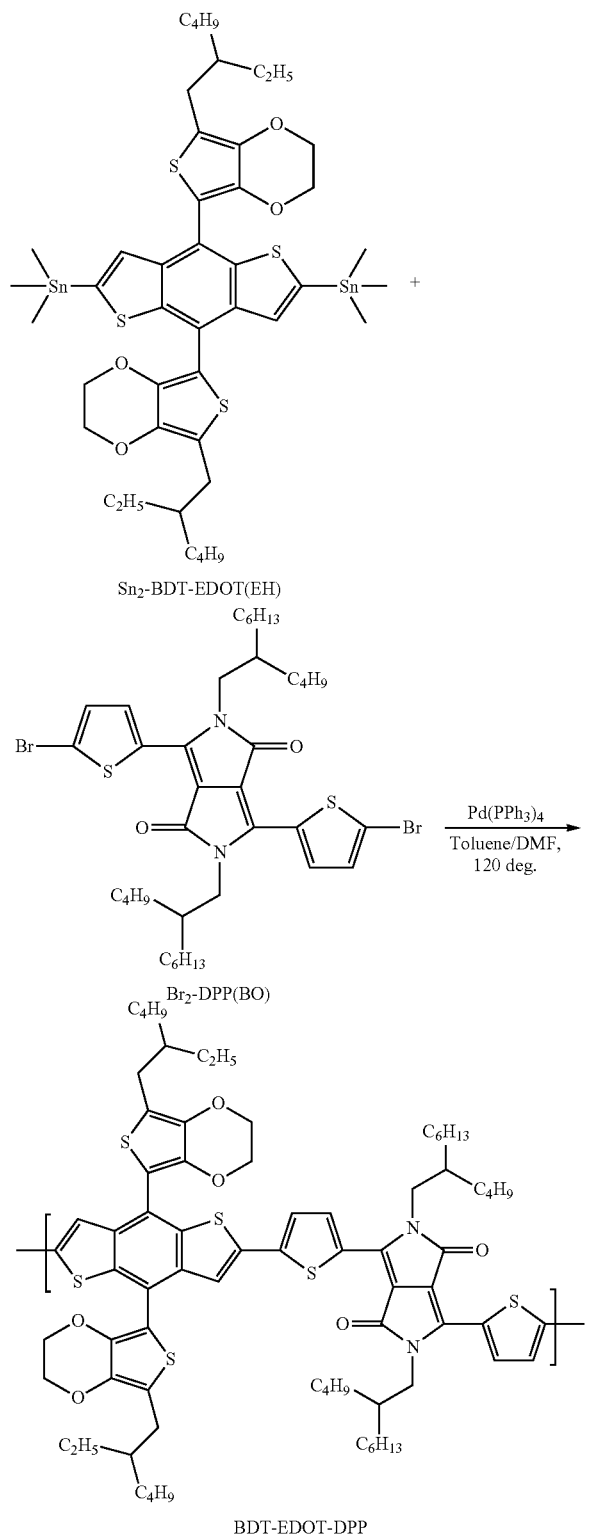

BDT-EDOT-DPP

To a 25 mL pre-dried flask were charged with Sn$_2$-BDT-EDOT(EH) (250 mg, 0.245 mmol), Br$_2$-DPP(BO) (194.68 mg, 0.245 mmol) and Pd(PPh$_3$)$_4$ (11.3 mg, 0.010 mmol). The flask was evacuated and refilled with argon, and this process was repeated 3 times. Then toluene (9.8 mL) and DMF (0.98 mL) were added. The obtained mixture was kept at 120° C. for 24 hours. The crude product was filtrated through celite, and collected by precipitating from acetone. The obtained solid was then rinsed in a Soxhlet extractor with MeOH, acetone, hexane and chloroform successively. The product in chloroform was concentrated, and then precipitated in hexane. After drying at a reduced pressure, the title copolymer (301 mg) was obtained in 92.55% yield.

Comparative Example 1 Synthesis of BDT-T-DPP

1. Preparation of Sn$_2$-BDT-T(EH) as Donor Unit

The synthesis of (4,8-bis(5-(2-ethylhexyl)thiophen-2-yl)benzo[1,2-b:4,5-b']dithiophene-2,6-diyl)bis(trimethylstannane) (Sn$_2$-BDT-T(EH)) was carried out in accordance with the procedure reported by L. Huo, et al (L. Huo, S. Zhang, X. Guo, F. Xu, Y. Li, J. Hou, Angew. Chem. Int. Ed. 2011, 50, 9697).

2. Preparation of Br$_2$-DPP(BO) as Acceptor Unit

Br$_2$-DPP(BO) was prepared with the same process as Example 1.

3. Preparation of Donor-Acceptor Copolymer

The Synthesis of BDT-T-DPP from the Sn$_2$-BDT-T(EH) and Br$_2$-DPP(BO) was carried out through the same procedure as that of BDT-EDOT-DPP in Example 1. And the title copolymer was attained in 82.36% yield.

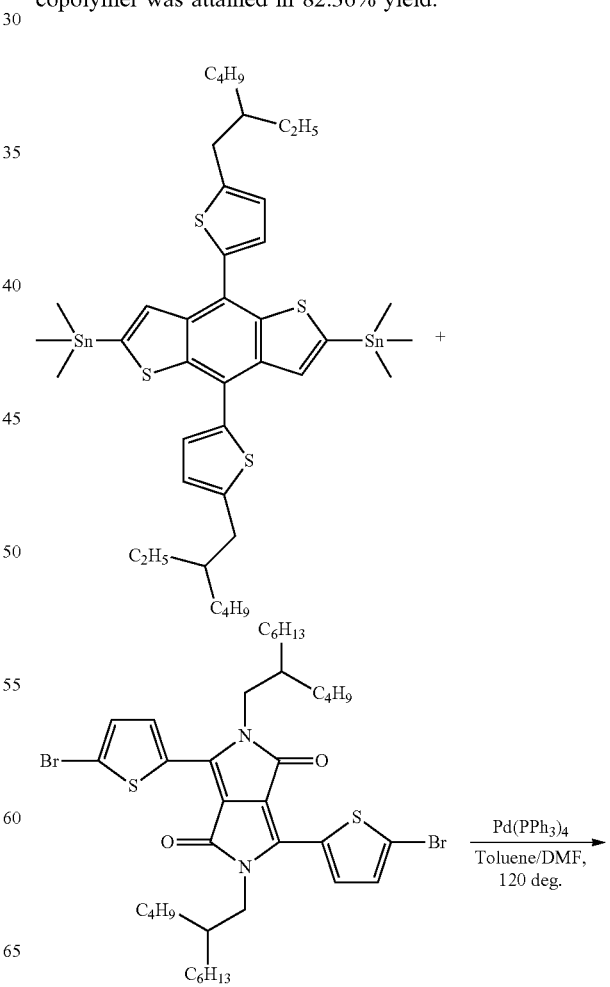

-continued

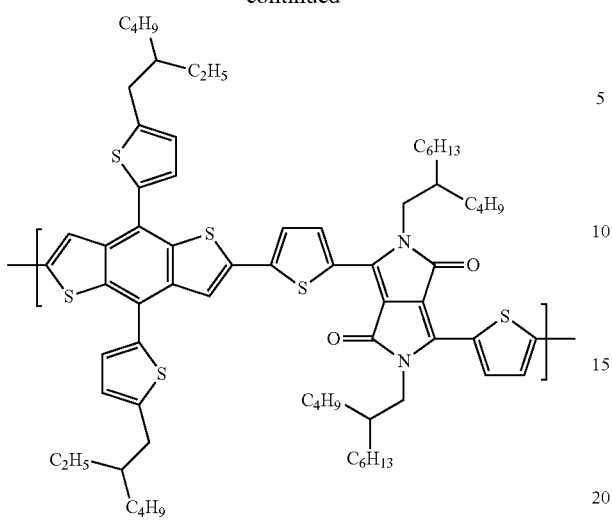

Example 2 Synthesis of BDT-EDOT-TPD

1. Preparation of Sn$_2$-BDT-EDOT(EH) as Donor Unit

The donor unit Sn$_2$-BDT-EDOT(EH) was obtained in the same process as in Example 1.

2. Preparation of Br$_2$-TPD as Acceptor Unit

The acceptor unit 1,3-dibromo-5-octyl-4H-thieno[3,4-c]pyrrole-4,6(5H)-dione (Br$_2$-TPD) was synthesized according to the procedure reported by Y. P. Zou, et al (Y. P. Zou, A. Najari, P. Berrouard, S. Beaupre, B. R. Aich, Y. Tao, M. Leclerc, *J. Am. Chem. Soc.* 2010, 132, 5330).

3. Preparation of Donor-Acceptor Copolymer

Synthesis of BDT-EDOT-TPD was carried out in accordance with the following procedure.

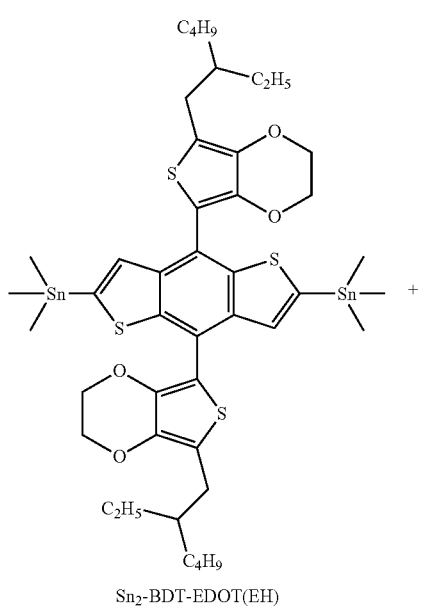

Sn$_2$-BDT-EDOT(EH)

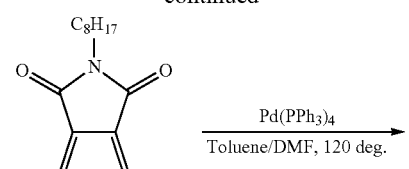

Br$_2$-TPD

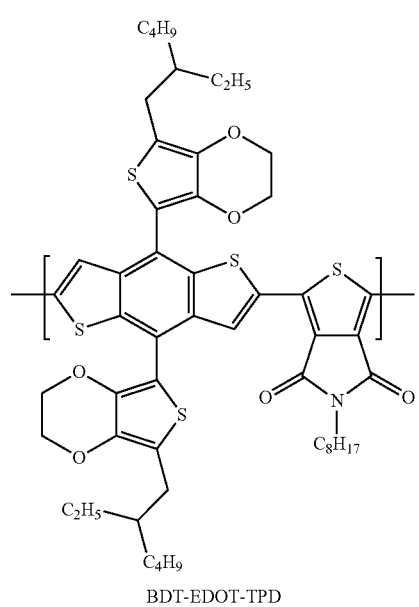

BDT-EDOT-TPD

Synthesis of BDT-EDOT-TPD

To a 25 mL pre-dried flask were charged with Sn$_2$-BDT-EDOT(EH) (250 mg, 0.245 mmol), Br$_2$-TPD (103.64 mg, 0.245 mmol) and Pd(PPh$_3$)$_4$ (11.3 mg, 0.010 mmol). The flask was evacuated and refilled with argon, and this process was repeated 3 times. Then toluene (9.8 mL) and DMF (0.98 mL) were added. The obtained mixture was kept at 120° C. for 24 hours. The crude product was filtrated through celite, and collected by precipitating from acetone. The obtained solid was then rinsed in a Soxhlet extractor with MeOH, acetone, hexane and chloroform successively. The product in chloroform was concentrated, and then precipitated in hexane. After drying at a reduced pressure, the title product was obtained in 98.16% yield.

Comparative Example 2 Synthesis of BDT-T-TPD

The Synthesis of BDT-T-TPD from the Sn$_2$-BDT-T(EH) and Br$_2$-TPD was carried out through the same procedure as that of BDT-EDOT-TPD in Example 2. And the title copolymer was attained in 79.65% yield.

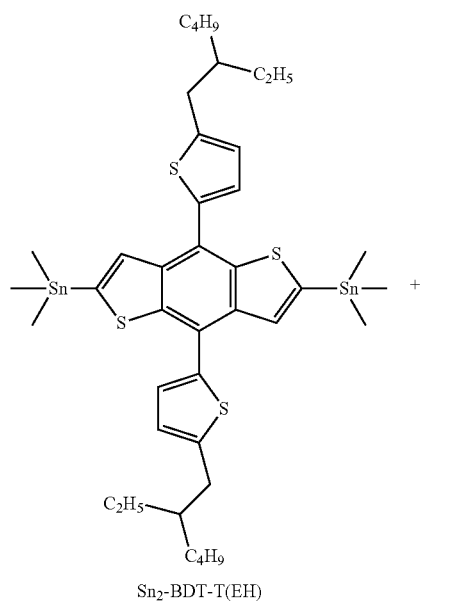

Sn$_2$-BDT-T(EH)

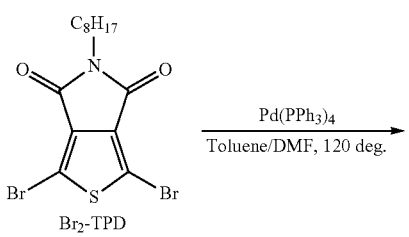

Br$_2$-TPD

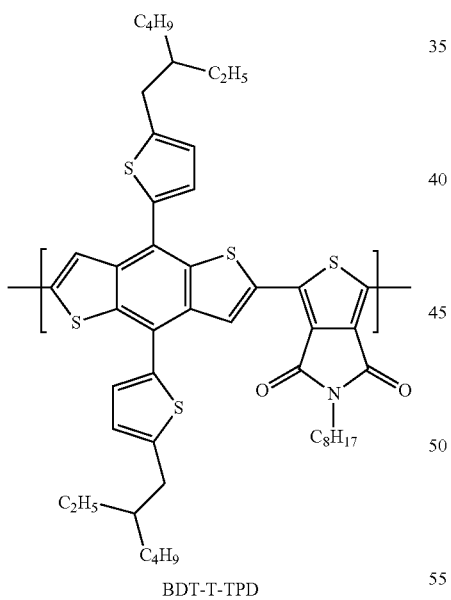

BDT-T-TPD

Example 3 Synthesis of BDT-EDOT-TIIDG

To further confirm the universality of the functionality of the EDOT unit, a low bandgap polymer containing an EDOT unit in the side chain was also synthesized and used for the fabrication of polymer photodetector according to the present application. The molecular structure of the low bandgap polymer BDT-EDOT-TIIDG is represented by formula (II).

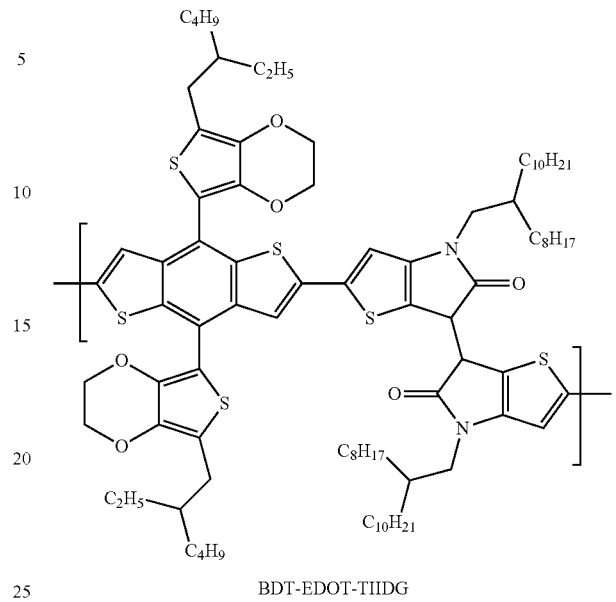

BDT-EDOT-TIIDG

1. Preparation of BDT-EDOT-TIIDG as Donor Unit

The donor unit Sn$_2$-BDT-EDOT(EH) was obtained in the same process as in Example 1.

2. Preparation of Br$_2$-TIIDG

A thienoisoindigo compound, 2,2'-dibromo-4,4'-bis(2-octyldodecyl)-[6,6'-bithieno[3,2-b]pyrrolylidene]-5,5'(4H, 4'H)-dione (Br$_2$-TIIDG) was synthesized according to the procedure reported by G. W. P. Van Pruissen, et al (G. W. P. Van Pruissen, F. Gholamrezaie, M. M. Wienk, R. A. J. Janssen, *J. Mater. Chem.* 2012, 22, 20387).

3. Preparation of Donor-Acceptor Copolymer

Synthesis of BDT-EDOT-TIIDG was carried out according to the following procedure.

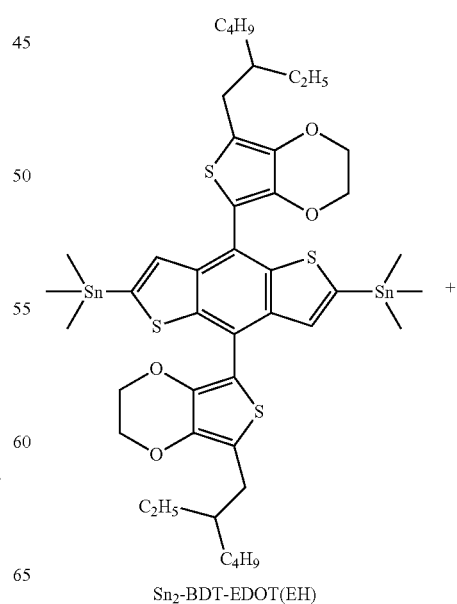

Sn$_2$-BDT-EDOT(EH)

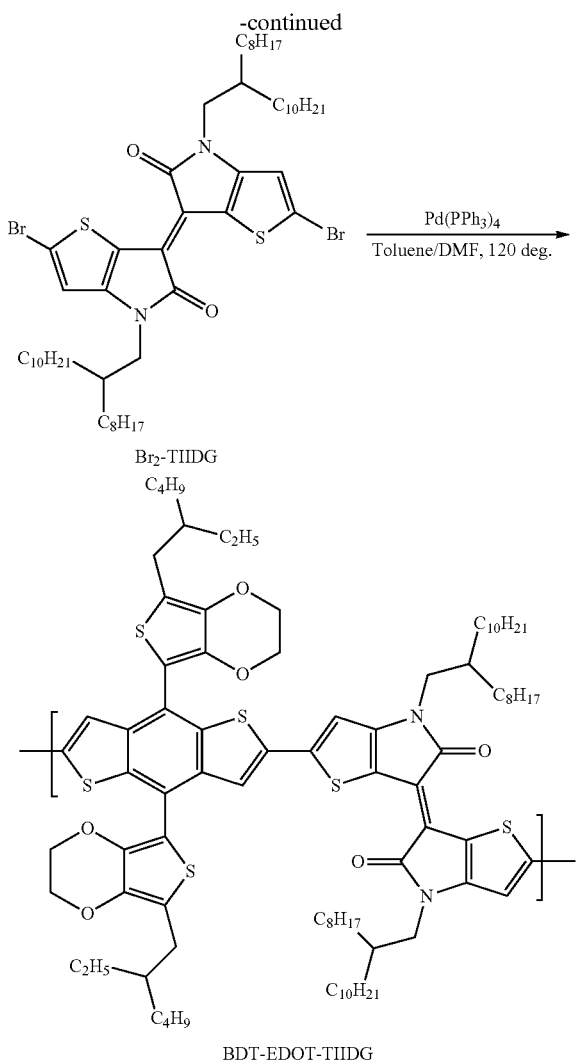

Br₂-TIIDG

BDT-EDOT-TIIDG

Synthesis of BDT-EDOT-TIIDG

This copolymer was obtained through the same procedure as the preparation process for BDT-EDOT-DPP in Example 1, except the Br₂-DPP(BO) was replaced with Br₂-TIIDG. And the title product was attained in 71.5% yield.

Example 4 Manufacture and Test of Optoelectronic Device Containing BDT-EDOT-DPP

An optoelectronic device having the structure of ITO/PEDOT:PSS/active layer/PFN/Al as shown in FIG. 3 was made, wherein the indium tin oxide (ITO) was the bottom layer. The device includes a transparent metal oxide electrode, i.e. ITO and a layer of PEDOT:PSS as an anode, a conjugated polyelectrolyte PFN modified Al as a cathode, and the photoactive layer made from EDOT polymer and PCBM is sandwiched between the two electrodes. In this Example, the EDOT polymer is BDT-EDOT-DPP, the PCBM is $PC_{71}BM$, and in the comparative Example, the EDOT polymer is BDT-T-DPP, the PCBM is the same as this Example.

The process for fabricating the optoelectronic device is summarized as follows. An ITO substrate was ultrasonically washed in detergent, deionized water, acetone, and isopropanol sequentially. Then the ITO substrate was dried in an oven and treated in an ultraviolet-ozone chamber for 4 min. A PEDOT:PSS [poly(3,4-ethylenedioxythiophene):poly (styrenesulfonate)] aqueous solution was filtered through a 0.22 μm filter membrane and spin-coated at 2500 rpm for 30 s on the ITO electrode, then baked at 150° C. for 10 min in air. The PEDOT:PSS layer has the thickness of about 40 nm. Subsequently, the substrate consisting of ITO layer and PEDOT:PSS layer was transferred to the nitrogen-filled glove-box. The BDT-EDOT-DPP prepared in Example 1 was mixed with $PC_{71}BM$ (1:2, w/w) ($PC_{71}BM$: [6,6]-phenyl $C_{71}$-butyric acid methyl ester) and the mixture was dissolved in chloroform/1,2-dichlorobenzene (95:5, v/v). The molecular structure of $PC_{71}BM$ can be represented by formula (III).

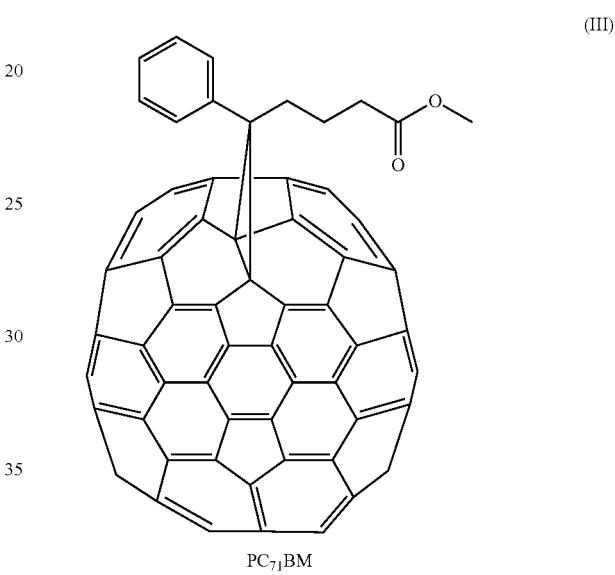

(III)

$PC_{71}BM$

The obtained solution was spin-coated on the PEDOT:PSS layer in the glove-box to form an active layer (DPP film) with the thickness of about 130 nm. A poly[(9,9-bis (3'-(N,N-dimethylamino)propyl)-2,7-fluorene)-alt-2,7-(9,9-dioctylfluorene)] (PFN) layer was covered onto the active layer before Al electrode deposition. Finally, this obtained structure was transferred to a vacuum chamber and a 100 nm of Al was thermally deposited on the PFN layer under a base pressure of $3 \times 10^{-6}$ mbar. The photoactive layer area of the obtained device was 0.16 cm².

The current density versus voltage (J-V) measurement of the obtained device under AM1.5G solar simulator illumination (100 mW cm⁻²) was performed on a computer-controlled Keithley 2400 Source Measure Unit in air. The J-V characteristics of the device in dark were measured on a computer-controlled Keithley 236 Source Measure Unit in a glove-box. The monochromatic external quantum efficiency was measured under ambient atmosphere at room temperature using a DSR100UV-B spectrometer with a SR830 lock-in amplifier. A bromine tungsten lamp was used as the light source in this test.

Comparative Example 4 Manufacture and Test of Optoelectronic Device Containing BDT-T-DPP In this Example, the manufacture method of the control device was the same as that of Example 4 except that the EDOT contained in the active layer was replaced by thiophene. The BDT-T-DPP made in comparative Example 1 was mixed with $PC_{71}BM$ (1:2, w/w) ($PC_{71}BM$: [6,6]-phenyl $C_{71}$-butyric acid methyl ester) and the mixture was dissolved in chloroform/1,2-dichlorobenzene (95:5, v/v). The obtained solution was coated on the substrate consisting of ITO layer and PEDOT:PSS layer in the glove-box to form an active layer with the thickness of about 130 nm.

Example 5 Manufacture and Test of Optoelectronic Device Containing BDT-EDOT-TPD

A photoelectric device having the structure of ITO/PEDOT:PSS/active layer/PFN/Al as shown in FIG. 3 was made, wherein the ITO was the bottom layer. An indium tin oxide (ITO) substrate was obtained and ultrasonic washed in detergent, deionized water, acetone, and isopropanol sequentially. Then the ITO substrate was dried in an oven and treated in an ultraviolet-ozone chamber for 4 min. A PEDOT:PSS aqueous solution filtered through a 0.22 μm filter membrane was spin-coated at 2500 rpm for 30 s on the ITO substrate, then baked at 150° C. for 10 min in air. The obtained PEDOT:PSS layer has the thickness of about 40 nm. Subsequently, the structure consisting of ITO layer and PEDOT:PSS layer was transferred to the nitrogen-filled glove-box. The BDT-EDOT-TPD made in Example 2 was mixed with $PC_{61}BM$ (1:1, w/w) ($PC_{61}BM$: [6,6]-phenyl $C_{61}$-butyric acid methyl ester) and the mixture was dissolved in chloroform/1,8-diiodooctance (97:3, v/v). The molecular structure of $PC_{61}BM$ can be represented by formula (IV).

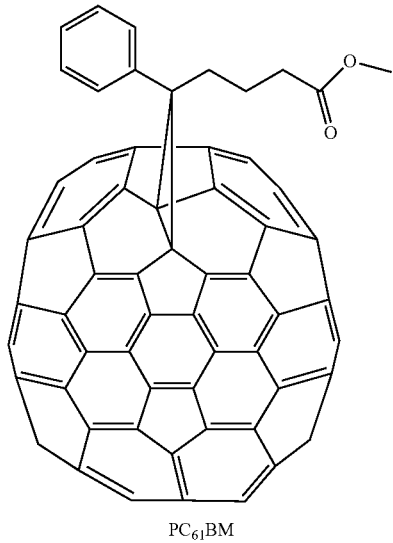

$PC_{61}BM$ (IV)

The obtained solution was spin-coated on the PEDOT:PSS layer to form an active layer with the thickness of about 100 nm. A poly[(9,9-bis(3'-(N,N-dimethylamino)propyl)-2,7-fluorene)-alt-2,7-(9,9-dioctylfluorene)] (PFN) layer was covered on the active layer. Finally, this obtained structure was transferred to a vacuum chamber and a 100 nm of Al was thermally deposited on the PFN layer under a base pressure of $3 \times 10^{-6}$ mbar. The photoactive layer area of the obtained device was 0.16 $cm^2$.

The J-V measurement of the obtained device was performed with the same process as that of Example 4.

Comparative Example 5 Manufacture and Test of Optoelectronic Device Containing BDT-T-TPD The structure and preparation method of the device in this Example were the same as that of Example 5 except that the BDT-EDOT-TPD contained in the active layer was replaced with BDT-T-TPD. The preparation method of this device can be summarized as: an ITO substrate was ultrasonic washed in detergent, deionized water, acetone, and isopropanol sequentially. Then it was dried in an oven and treated in an ultraviolet-ozone chamber for 4 min. A PEDOT:PSS layer of 40 nm was coated on the ITO substrate. The BDT-T-TPD made in comparative Example 2 was mixed with $PC_{61}BM$ (1:1, w/w) ($PC_{61}BM$: [6,6]-phenyl $C_{61}$-butyric acid methyl ester) and they were dissolved in chloroform/1,8-diiodoctance (97:3, v/v). This solution was coated on the PEDOT:PSS layer to form an active layer of 100 nm. A PFN layer was covered on the active layer, and then an Al layer of 100 nm was deposited on the PFN layer to give the title device. The photoactive layer area of the device was 0.16 $cm^2$.

The J-V measurement of the obtained device was performed with the same process as that of Example 4.

Example 6

A photoelectric device having the structure of ITO/PEDOT:PSS/active layer/PFN/Al as shown in FIG. 3 was made, wherein the ITO was the bottom layer and the active layer comprises the BDT-EDOT-TIIDG made in Example 3. The preparation method of this device in this Example is the same as that of Example except the BDT-EDOT-TPD in the active layer was replace with BDT-EDOT-TIIDG made in Example 3.

The J-V measurement of the obtained device was performed with the same process as that of Example 4.

Results

Figure 2:
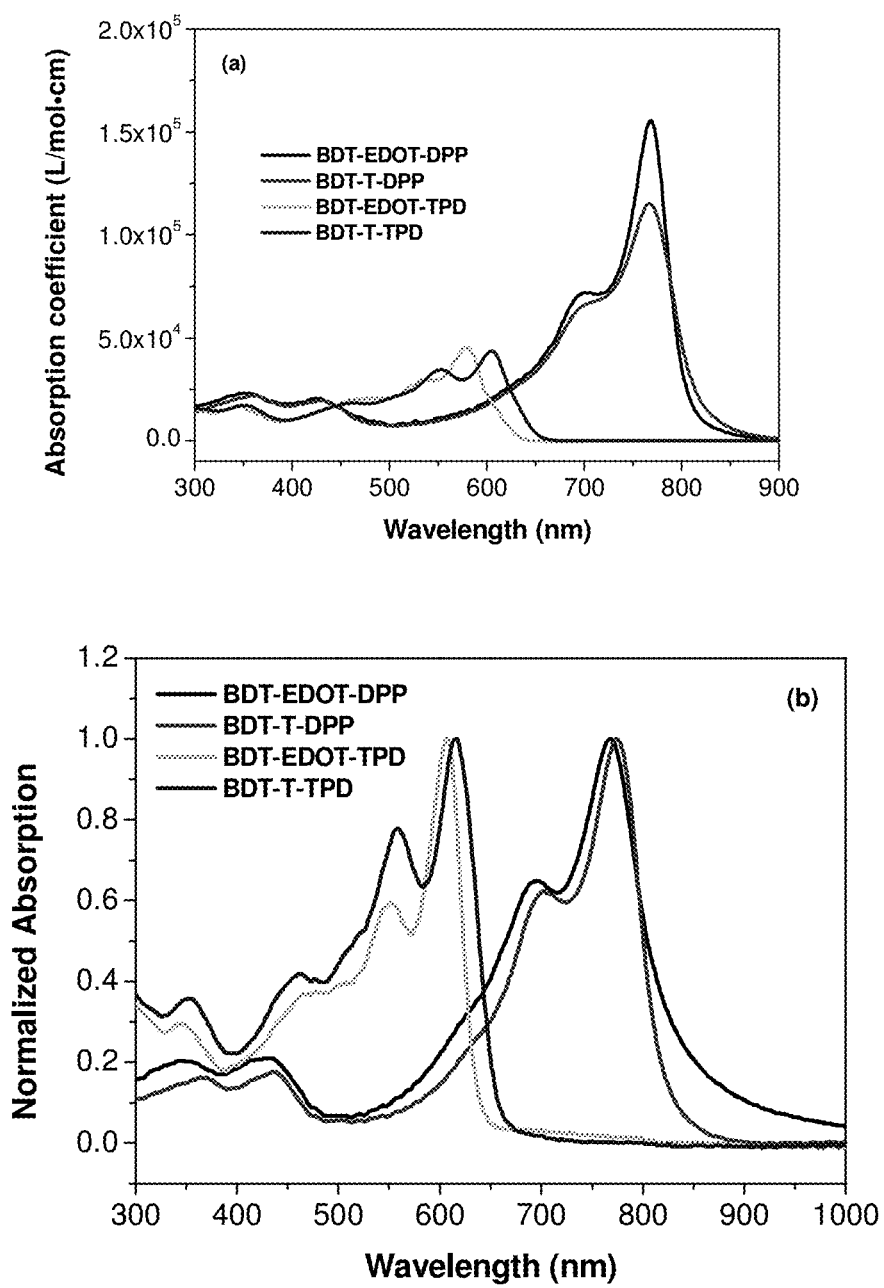
FIG. 2 shows the absorption spectra of the polymers according to an embodiment of the present application in solutions (a) and solid films (b).

FIG. 2 shows the absorption spectra of the polymers made in Examples 1-2 and Comparative Examples 1-2, wherein FIG. 2a) shows the absorption spectra of the polymers in chloroform (CF), and FIG. 2b) shows the absorption spectra of the polymers in solid films.

It can be seen from FIG. 2 that, the EDOT modified conjugated polymers (BDT-EDOT-DPP of Example 1, BDT-EDOT-TPD of Example 2) exhibit similar absorption spectra as the control polymers with thiophene as side chains (Comparative Examples 1-2). Regarding the result of DPP polymers dissolved in chloroform (CF, a concentration of 0.005 mg $mL^{-1}$), BDT-EDOT-DPP shows higher ratio of peak absorption (768 nm) to shoulder (700 nm) compared to thiophene modified one (BDT-T-DPP). TPD polymers (BDT-EDOT-TPD Vs BDT-T-TPD) have similar trend. Meanwhile, the absorption spectra of EDOT polymers showed blue shifts compared to thiophene counterparts, and this trend is more obvious in TPD polymer (BDT-EDOT-TPD).

The energy levels of the experimental polymers in Example 4 and comparative Example 4 are measured with Cyclic Voltammetry (CV), and the data of highest occupied molecular orbital (HOMO) and the lowest unoccupied molecular orbital (LUMO) are showed in FIG. 3. It can be seen from the graphs that the introduction of EDOT into a conjugated copolymer as a side chain causes the slight increase of the polymer bandgap compared to the introduction of a thiophene polymer. FIG. 3 also shows that the EDOT polymers exhibit higher HOMO energy level than thiophene polymers.

Figure 4:
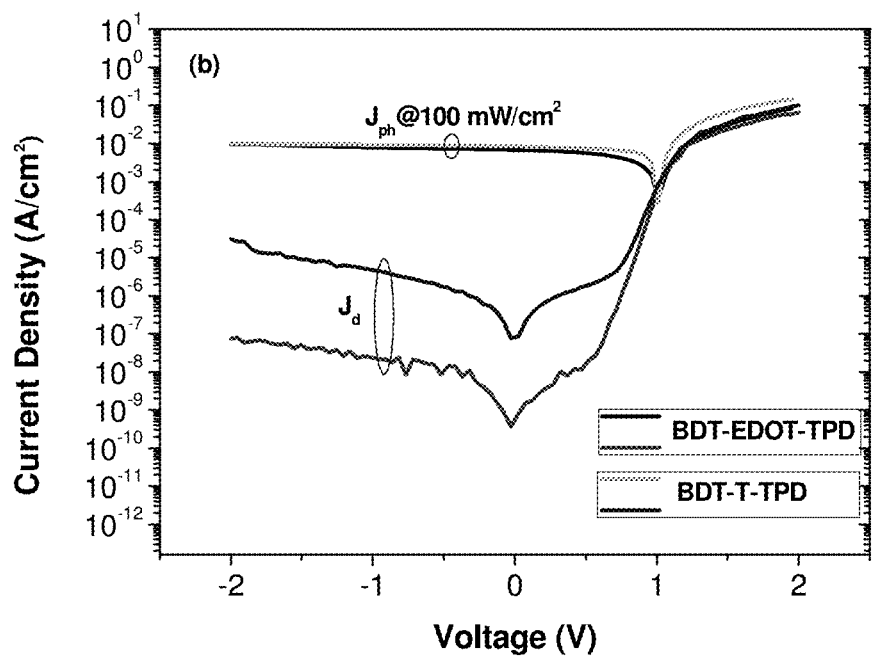
FIGS. 4-9 show the J-V measurement results of the device according to an embodiment of the present application.

The current-voltage characteristics of polymer photodetector made in Examples 4-5 and Comparative Examples 4-5 are shown in FIG. 4, wherein FIG. 4a) shows the short-circuit current density of BDT-EDOT-DPP devices is comparable with that of BDT-T-DPP devices, indicating that charge carriers are generated efficiently in both systems. FIG. 4b) shows the measurement result of BDT-EDOT-TPD and BDT-EDOT-TPD. However, the dark current at reverse voltage observed from BDT-EDOT-DPP device is about 2 magnitudes lower than that from BDT-T-DPP device, resulting in a rectification ratio of $10^6$ at ±2.0 V. The excellent diode characteristic observed from the BDT-EDOT-DPP devices indicates that the introduction of an EDOT unit in the side chain can significantly depress the intrinsic leakage current of the diode under dark conditions. This phenomenon was also observed in the larger bandgap TPD polymer system. The EDOT polymer exhibits a dark current of $7.5 \times 10^{-8}$ A/cm$^2$ at $-2$ V, while thiophene polymer shows a dark current of $3.1 \times 10^{-5}$ A/cm$^2$ (FIG. 5b). The BDT-EDOT-TPD devices show a photocurrent density of 8.23 mA/cm$^2$ at short-circuit condition under AM1.5G illumination, indicating the generation of charge carriers is efficient in this EDOT modified polymer.

Figure 5:
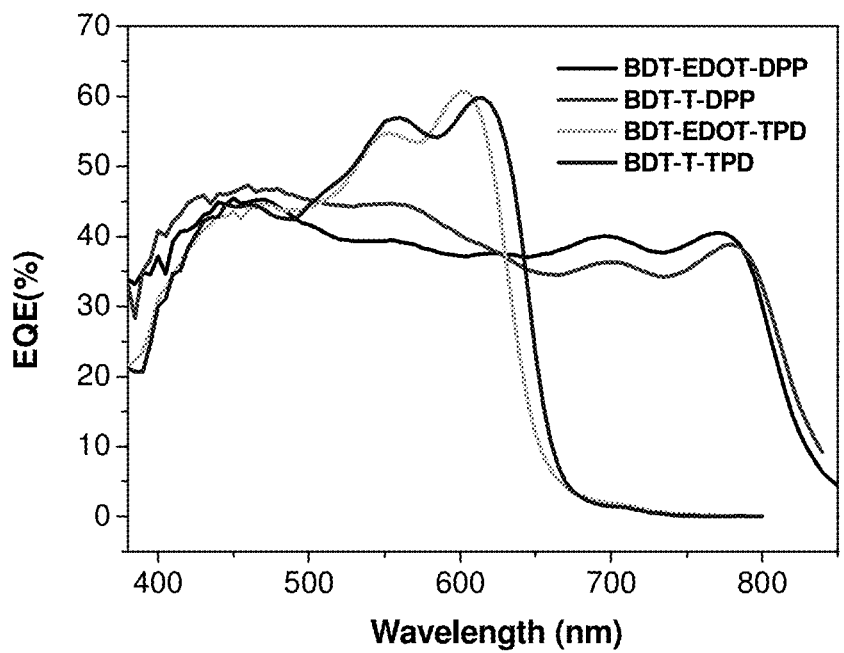

FIG. 5 shows the external quantum efficiencies (EQE), which parameter indicates the photon to charge conversion ability, of the polymer photodetectors made in Example 4-5 and Comparative Example 4-5. It can be seen that both BDT-EDOT-DPP and BDT-T-DPP devices exhibit good photon to charge conversion ability, and the BDT-EDOT-TPD and BDT-T-TPD devices can also effectively harvest corresponding light and generate photocurrent efficiently.

Figure 6:
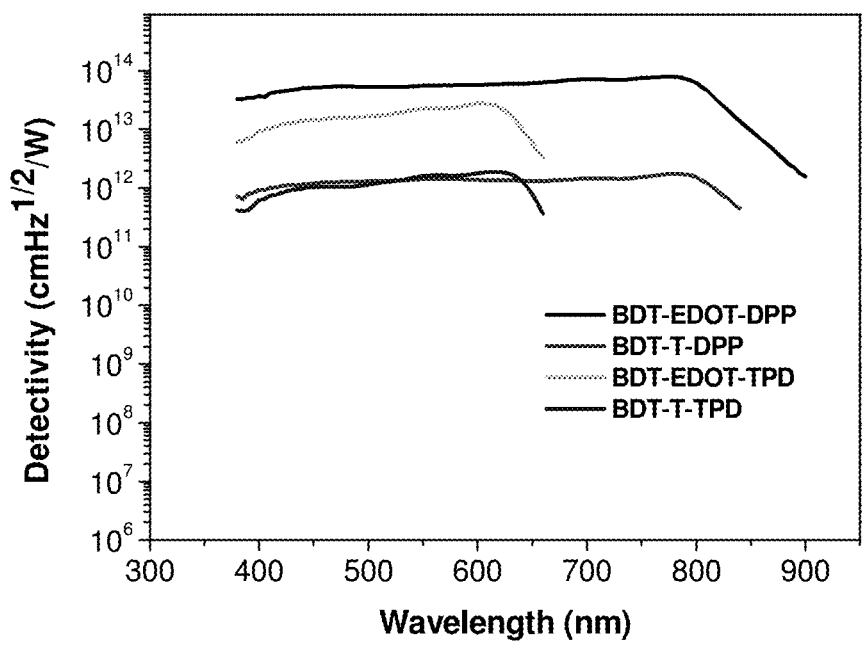

In this field, there are several figures of merits can be used to evaluate the quality and effectiveness of the experimental photodetectors. One figure of merit is the noise equivalent power (NEP), which can be calculated as:

$$NEP = (A\Delta f)1/2/D^*,$$

wherein A is the effective area of the detector in cm$^2$, $\Delta f$ is the electrical bandwidth in Hz, and D* is the detectivity measured in units of Jones. Here we use the equation $$D^* = EQE \times (\lambda/1240)/(2qJ_d)^{1/2}$$

to calculate the value of D*, wherein q is the absolute charge $1.60 \times 10^{-19}$ C, $J_d$ is the dark current in A/cm$^2$, $\lambda$ is the wavelength. FIG. 6 shows the detectivities of the polymer photodetectors, in which the $J_d$ was $3.125 \times 10^{-11}$ A/cm$^2$ at zero voltage in dark. It can be seen that BDT-EDOT-DPP device has about $8.0 \times 10^{13}$ Jones at 775 nm. However, the BDT-T-DPP device shows a maximum detectivity of only $1.7 \times 10^{12}$ Jones within the response spectra. For TPD polymers, the device exhibits similar behavior with DPP polymer detectors. With the EDOT group in the side chain, BDT-EDOT-TPD detector exhibits about $2.7 \times 10^{13}$ Jones at 605 nm. Nevertheless, the BDT-T-TPD device only shows less than $1.9 \times 10^{12}$ Jones within the response spectra. These results demonstrate that the introduction of EDOT side chains can afford efficient polymers for photodetector with high detectivities.

Figure 7:
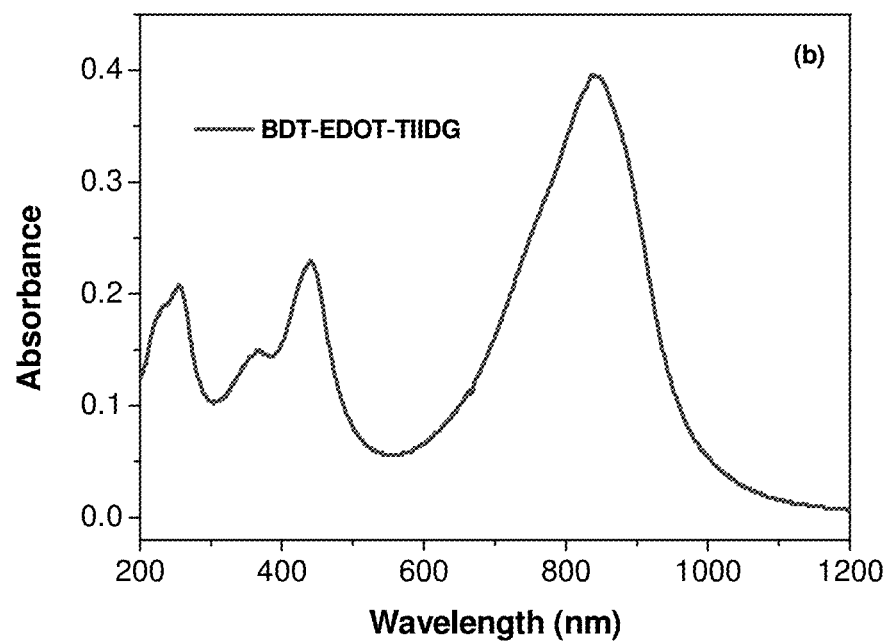

The optical absorption spectrum of BDT-EDOT-TIIDG film made in Example 3 is shown in FIG. 7. It can be seen that BDT-EDOT-TIIDG exhibits a main strongest peak at 840 nm covering absorption from 400 nm to 1000 nm, and its absorption edge extends to 1085 nm. The optical bandgap of BDT-EDOT-TIIDG extracted from its absorption spectrum is about 1.14 eV.

Figure 8:
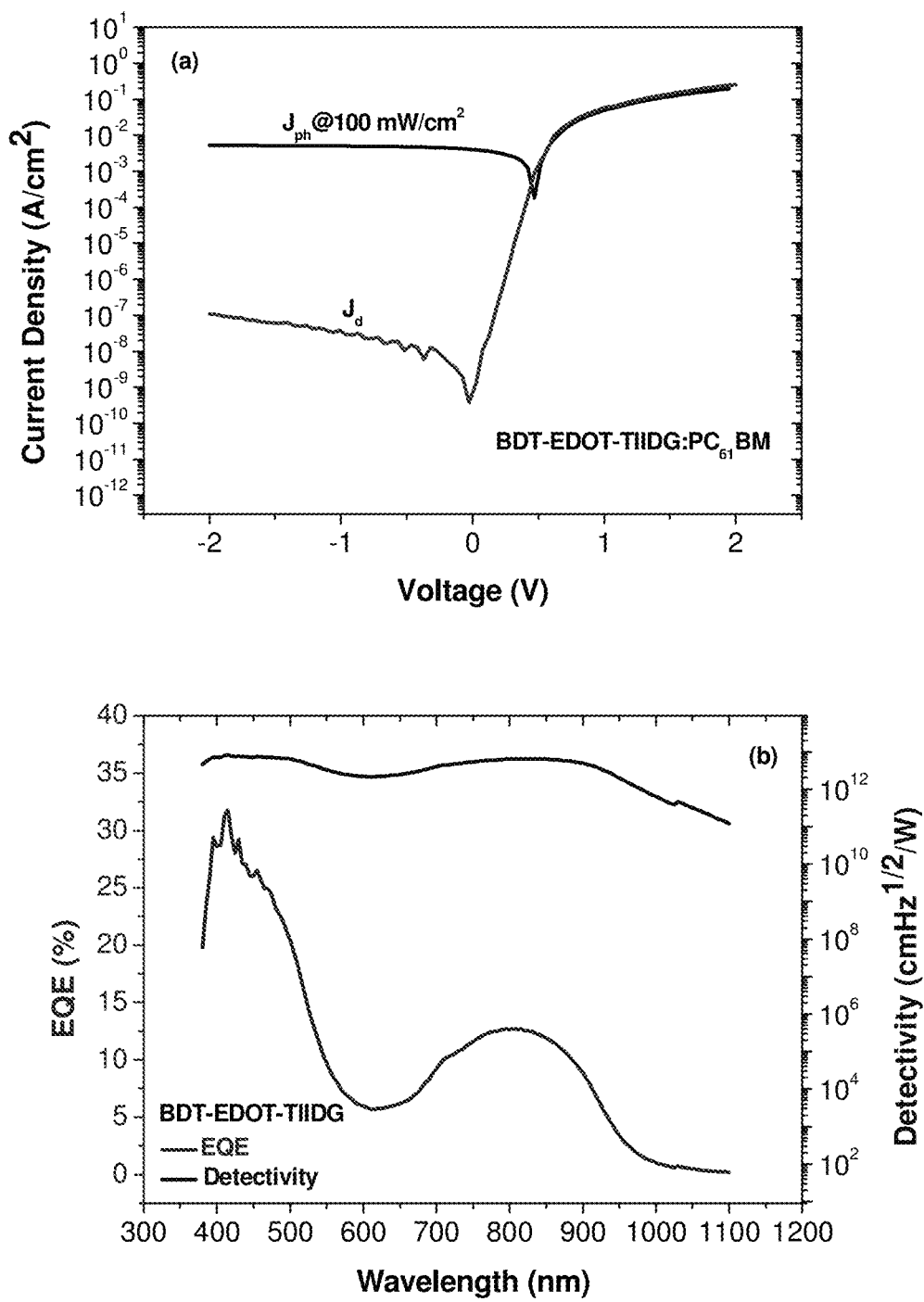

FIG. 8 shows the J-V characteristics of BDT-EDOT-TIIDG based photodetectors under illumination and in dark (a), and the EQE and detectivity of BDT-EDOT-TIIDG based photodetectors (b). Similar with the two EDOT based polymers presented above, the BDT-EDOT-TIIDG devices also show very good diode characteristics, with a rectification ratio of over $10^6$ at ±2.0 V. At zero voltage, the current density of BDT-EDOT-TIIDG devices in dark is $5.4 \times 10^{-10}$ A/cm$^2$, indicating a low shot noise (shot noise is a type of electronic noise which originates from the discrete nature of electric charge.) in the devices including BDT-EDOT-TIIDG has a small bandgap of 1.14 eV. The detectivity of BDT-EDOT-TIIDG devices exceeds $10^{12}$ Jones from 380 nm to 975 nm, and over $10^{11}$ Jones extending to 1085 nm. The highest detectivity approached $6.3 \times 10^{12}$ Jones at 830 nm. This high detectivity is comparable with the results previously reported. All these results further demonstrate that the introduction of an EDOT unit in the side chain could effectively depress the dark current in the devices and thus enhance the detectivity of photodetectors.

Figure 9A:
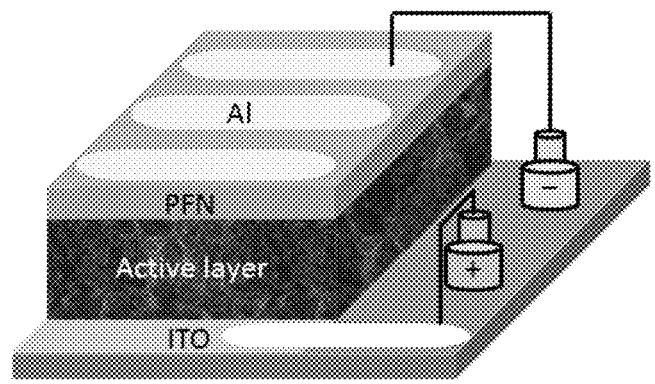
Figure 9B:
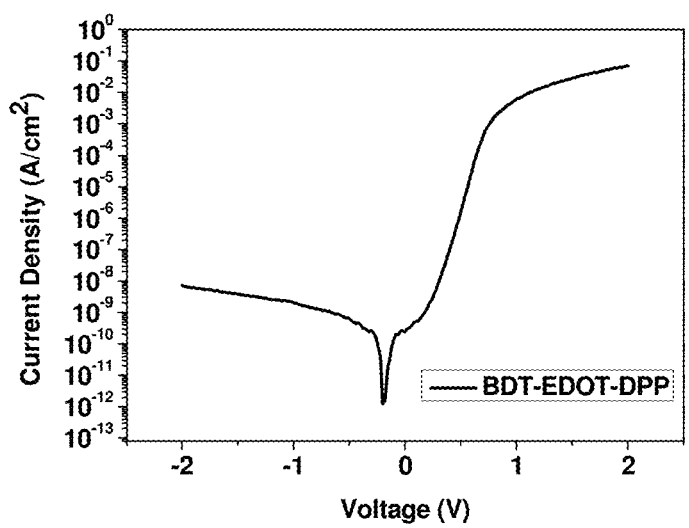
Figure 9C:
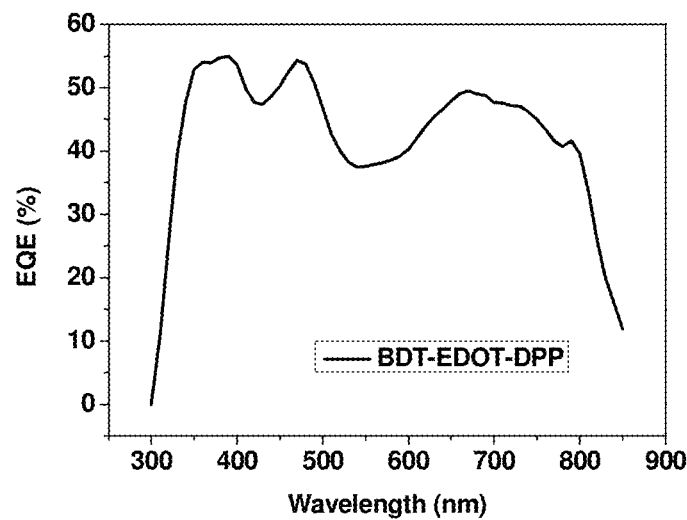
Figure 9D:
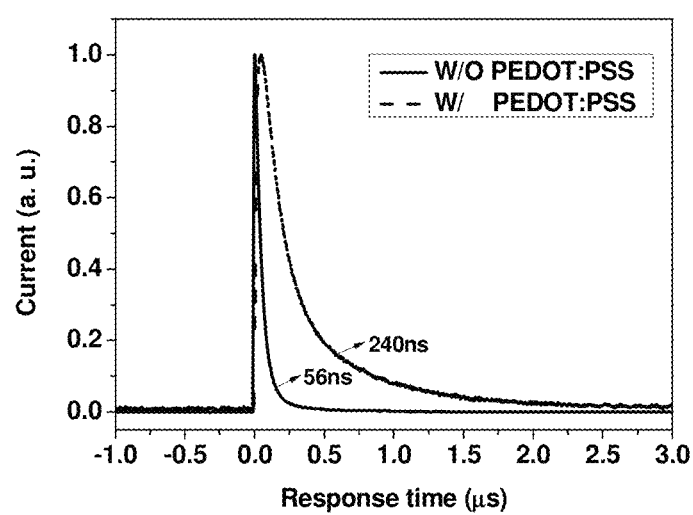

To confirm the dependence of EDOT polymer on device structure, a polymer photodetector with the structure of ITO/BDT-EDOT-DPP:PC$_{61}$BM/PFN/Al was fabricated, as shown in FIG. 9a. Without the PEDOT:PSS layer, the detector also showed good diode performance with rectification ratio of $9.68 \times 10^6$ at ±2.0V, which is shown in FIG. 9b. Moreover, the detector with the structure of ITO/BDT-EDOT-DPP:PC$_{61}$BM/PFN/Al exhibited good external quantum efficiency, indicating good photon-to-charge ability, shown in FIG. 9c. The device without the PEDOT:PSS layer showed a response time of 56 ns at the current decay to 1/e of the initial value; whereas the device with the PEDOT:PSS showed a response time of 240 ns at the same condition, seen in FIG. 9d. These results above indicated that the application of EDOT polymer to fabricate photodetector is a promising way to achieve fast response and sensitive photodetector.

It should be appreciated that, the above description is provided for purposes of illustrating, explaining, and describing embodiments of this invention. Modifications and adaptations to these embodiments will be apparent to those skilled in the art and may be made without departing from the scope or spirit of this invention.

We claim:

1. A donor-acceptor polymer comprising a 3,4-ethylenedioxythiophene ring connected to the backbone thereof as a side chain.

2. The donor-acceptor polymer of claim 1, wherein the 3,4-ethylenedioxythiophene ring has the structure of formula (I),

wherein R$_1$ is selected from the group consisting of C1-C20 alkyl, C1-C20 alkoxyl and C1-C20 alkylthiol.

3. The donor-acceptor polymer of claim 1, wherein the 3,4-ethylenedioxythiophene ring is connected to the donor unit on the backbone of the polymer.

4. The donor-acceptor polymer of claim 1, wherein the molar ratio of 3,4-ethylenedioxythiophene ring to donor unit on the backbone is 1:1 or 2:1.

5. The donor-acceptor polymer of claim 1, wherein the donor unit on the backbone of the polymer is selected from the group consisting of benzo[3,4-b]dithiophene, thiophene, benzene and the derivatives thereof.

6. The donor-acceptor polymer of claim 1, wherein the acceptor unit on the backbone of the polymer is selected from the group consisting of benzo[c][1,2,5]thiadiazole, benzo[c][1,2,5]oxadiazole, isoindoline-1,3-dione, quinoxaline, benzo[d][1,2,3]triazole, thieno[3,4-c][1,2,5]thiadiazole, thieno[3,4-b]pyrazine, thieno[3,4-b]thiophene, benzo[1,2-c:4,5-c']bis([1,2,5]thiadiazole), [1,2,5]thiadiazolo[3,4-g]quinoxaline, pyrazino[2,3-g]quinoxaline, [3,3'-biindolinylidene]-2,2'-dione, diketopyrrolopyrrole, thienopyrroledione, thienoisoindigo and the derivatives thereof.

7. The donor-acceptor polymer of claim 1, wherein the number of the donor-acceptor units on the backbone is 10 to 100.

8. A composition comprising: the donor-acceptor polymer of claim 1 blended with a fullerene derivative.

9. The composition of claim 8, wherein the fullerene derivative is selected from the group consisting of $PC_{61}BM$ and $PC_{71}BM$.

10. A photodetector device comprising a photoactive layer containing a composition comprising the donor-acceptor polymer of claim 1 blended with a fullerene derivative.

11. The photodetector device of claim 10, wherein the fullerene derivative is selected from the group consisting of $PC_{61}BM$ and $PC_{71}BM$.

12. The photodetector device of claim 10, wherein the photoactive layer is sandwiched between two electrodes, without an electron blocking layer or a hole extracting layer.

* * * * *